United States Patent [19]
Ratzel

[11] Patent Number: 5,138,261
[45] Date of Patent: Aug. 11, 1992

[54] NUCLEAR MAGNETIC RESONANCE TOMOGRAPH

[75] Inventor: Dieter Ratzel, Rheinstetten-Forchheim, Fed. Rep. of Germany

[73] Assignee: Bruker Medizintechnik GmbH, Rheinstetten-Forcheim, Fed. Rep. of Germany

[21] Appl. No.: 548,166

[22] Filed: Jul. 3, 1990

[30] Foreign Application Priority Data

Jul. 13, 1989 [DE] Fed. Rep. of Germany ....... 3923069

[51] Int. Cl.$^5$ .......................................... G01R 33/20
[52] U.S. Cl. .................... 324/318; 324/322
[58] Field of Search ............... 324/318, 322, 307, 313, 324/314; 128/653 SC

[56] References Cited

U.S. PATENT DOCUMENTS

| 4,777,443 | 10/1988 | Yabusaki et al. | 324/322 |
| 5,021,739 | 6/1991 | Yosokawa et al. | 324/318 |

FOREIGN PATENT DOCUMENTS

| 0152069 | 2/1985 | European Pat. Off. |
| 0238139 | 3/1987 | European Pat. Off. |
| 2540436 | 9/1975 | Fed. Rep. of Germany |
| 3522401 | 6/1985 | Fed. Rep. of Germany |
| WO88/09928 | 6/1987 | PCT Int'l Appl. |
| WO88/09929 | 6/1987 | PCT Int'l Appl. |
| 2053481 | 7/1979 | United Kingdom |

*Primary Examiner*—Hezron E. Williams
*Assistant Examiner*—Louis M. Arana
*Attorney, Agent, or Firm*—Rosenblum, Parish & Isaacs

[57] ABSTRACT

A nuclear magnetic resonance tomograph comprises a magnet surrounding a measuring space for receiving an object under test, e.g. a human body. A coil is provided for generating a high-frequency magnetic field within the measuring space. The coil is fed by a transmitter comprising a stage for adjusting the amplitude of a high-frequency current generated by the transmitter. A high-frequency magnetic field sensor is arranged at a predetermined calibration location outside the measuring space for measuring the high-frequency magnetic field strength prevailing at the predetermined calibration location. For calibrating the high-frequency magnetic field strength during a tomography measurement, the coil with the object under test inside is subjected to a test current and the resulting high-frequency magnetic field amplitude is sensed. From the value of the test current and the sensed high-frequency magnetic field strength one can calculate a measuring current to be fed into the coil for generating a desired high-frequency magnetic field strength within the measuring space.

8 Claims, 3 Drawing Sheets

NUCLEAR MAGNETIC RESONANCE TOMOGRAPH

BACKGROUND OF THE INVENTION

1. Field of the Invention

The present invention relates to nuclear magnetic resonance tomographs and, more particularly, to a nuclear magnetic resonance tomograph allowing to reproducibly calibrate the strength of the high-frequency magnetic field irradiated on a measuring space irrespective of the filling factor.

While the present invention is described herein with reference to a particular embodiment for a particular application, it is understood that the invention is not limited thereto. Those of ordinary skill in the art will recognize additional embodiments and applications within the scope thereof.

2. Description of the Related Art

Methods for calibrating the amplitude of a rf current of a nuclear magnetic resonance imaging apparatus are described in published international patent applications WO-A-88/09928 and WO-A-88/09929. In these prior art methods, rf test pulses are directed upon the object under test, usually a human body, and the resonance signals received are then evaluated. By selecting the pulse shape and pulse sequence of the nuclear resonance excitation pulses in a convenient manner, it is possible in this case to determine the amplitude of the rf excitation in absolute values, by evaluation of the measuring signals.

published European patent application EP-A-0 238 139 describes an image-generating nuclear magnetic resonance method where the pulse angle, i.e. the duration of the rf excitation pulses, is determined again by directing a predetermined pulse sequence upon an object under test and evaluating the measuring signals received as a response thereto.

Published European patent application EP-A-0 152 069 describes an imaging nuclear magnetic resonance apparatus where standardized reference samples are arranged in the direct neighborhood of the object under test within the measuring space. Scaling of the measuring signals received from the test objects is effected by comparing the measuring signals received from the reference samples with the measuring signals received from the object under test, i.e. a human body.

Moreover, a probe head for use in NMR tomography has been known from published German patent application DE-A-35 22 401. This probe head has substantially the form of a hollow cylinder whose outer surface and end faces are closed for rf currents and whose cylindrical inner surface is subdivided into conductive and non-conductive axial strips. Inside the known probe head a substantially homogeneous magnetic rf field is produced which has a direction perpendicular to the probe head axis.

As is generally known, an object under test, for example a portion of a human body or an entire human body, for performing nuclear magnetic resonance imaging is introduced into a measuring space which is surrounded by a conventional rf coil and also by a magnet system and, further, by gradient coils establishing constant magnetic fields having a predetermined gradient of magnetic field strength. The object under test is exposed to a constant magnetic field of high homogeneity and, further, to a rf magnetic field directed at a right angle relative to the constant magnetic field.

Whenever, in the scope of this invention, reference is made hereinafter to a "rf coil" of a "high-frequency coil", this term is to be understood as describing any high-frequency system capable of generating a high-frequency magnetic field of sufficient homogeneity and field strength in a larger three-dimensional space. Such coils may take the for of, for example, saddle coils, Helmholtz coils, line resonators, strip resonators or the like. For the purposes of the present invention, a hollow cylindrical high-frequency resonator of the type described by the afore-mentioned published German patent application DE-A-35 22 401 is particularly preferred, although the invention is by no means limited to such a probe head arrangement.

As is generally known, nuclear resonance signals are generated in nuclear magnetic resonance tomography by using pulsed high-frequency signals having a frequency proportional to the field strength of the constant magnetic field where the proportionality is given by the gyromagnetic factor of the particular nucleus under investigation.

By exciting the nuclear spins with pulsed high-frequency magnetic fields, the spin magnetization is caused to flip by a given angle relative to the direction of the constant magnetic field. This so-called flip angle is defined by the pulse area, so that the flip angle may be adjusted by adjusting the pulse length and/or the pulse amplitude.

In order to generate measuring signals of maximum intensity, i.e. optimum nuclear magnetic resonance excitation, it is customary to apply pulses having a flip angle of 90° or 180° in order to either flip the magnetization into a radial plane or transfer it into a state of anti-magnetization, with inverse sign.

When adjusting the nuclear magnetic resonance tomograph, one, therefore, seeks to adjust the flip angle with the greatest possible accuracy to the value of 90° or 180° in order to achieve the greatest possible signal yield.

Now, the determination of the pulse length does not create too big a technical problem because suitable time controls and gate circuits are available enabling the pulse duration to be adjusted with sufficient precision and at reasonable expense.

On the other hand, however, it has been mentioned before that the flip angle depends not only on the pulse length, but also on the pulse amplitude so that the latter, i.e. the amplitude of the rf magnetic field effective at the measuring space, must be adjusted as well.

Now, the amplitude of the magnetic high-frequency field is not simply proportional to the amplitude of the high-frequency excitation current within the coil. Rather, the amplitude of the magnetic high-frequency field additionally depends on the degree of loading of the high-frequency resonant circuit. If, for example, one and the same high-frequency coil is to be used for examining a very little or very thin patient on the one hand and a large or very fat patient on the other hand, then the so-called filling factor will change due to the fact that the patient's tissue leads to both dielectric losses and magnetic losses as a result of eddy currents generated the patient. In addition, the loading of the high-frequency resonance circuit may vary when the very little or thin patient, or the respective part of a patient's body does not take up the whole space within the coil and when the position of the test object in the coil is not exactly defined.

In all these cases, absolutely undefined conditions are encountered regarding the interdependence of the effective high-frequency magnetic field and the high-frequency excitation current so that it is by no means possible to achieve calibrated conditions with regard to the high-frequency fields strength by adjusting the excitation current.

It must be additionally taken into account that many countries have enacted legislations prescribing limits for the maximum permissible exposure of the human body to high-frequency radiation. In the U.S., for example, the competent FDA has promulgated standards defining a threshold value of 0.4 W of effective high-frequency power per kilogram of weight of the patient's body within the sample space.

It is, therefore, necessary not only for signal-maximizing purposes, but also in the interest of a patient's safety, to calibrate, i.e. to adjust in a reproducible manner, the effective high-frequency field strength, i.e. the amplitude of the high-frequency magnetic field.

With conventional nuclear magnetic resonance tomographs, this is achieved by initially carrying out NMR measurements with an arbitrarily adjusted amplitude of magnetic high-frequency field, with the sample space loaded, i.e. with the patient in place in the tomograph. The tomograph operator then observes the free induction decay (FID) signal on a CRT screen varying in response to the amplitude of the high-frequency magnetic field which is conventionally adjusted manually. The operator then tries—by trial and error, i.e. by varying the amplitude arbitrarily—to find the point where the FID signal reaches its maximum because a further increase of the amplitude (always related to a constant pulse length) would lead to the flip angle of, for example, 90° being exceeded, and then the signal amplitude would drop again as soon as the flip angle exceeds 90°.

This conventional empirical method is, however, subject to a number of drawbacks:

First, this adjustment procedure is extremely time consuming as several scans have to be observed if a reliable assessment of the FID signal is to be made so that one has to wait 5 to 10 seconds, for example, per test measurement. In practice, this has the effect that at the end of this waiting period the user may have forgotten the measuring value previously adjusted; or else an impatient operator of the tomograph may not wait for the full period, but decide to repeat the measurements in quicker sequence, in which case numerous errors may slip in, for example due to dynamic effects of nuclear magnetic resonants.

In addition, considerable errors may result when the maximum of the FID signal to be found is not clearly defined. If, for example, a 180° is to be determined via the maximum of the echo signal, then a corresponding maximum echo signal will be encountered also at 540°, i.e. generally at a flip angle equal to 2n−1 times the desired flip angle. Consequently, it may well happen that the operator of a tomograph adjusts a 540° pulse instead of a 180° pulse without becoming aware of his error. However, a 540° pulse, as compared with a 180° pulse means that the high-frequency magnetic field strength is exceeded by a factor of 3.

Erroneous adjustments of the type mentioned before are well possible in practice because the high-frequency power output of NMR tomographs has to be rated such that both very small objects under tests (small children) and very large objects under test (fat adult patients) may be examined. While in the first mentioned case, for example, a high-frequency power of 100 W would be sufficient, a high-frequency power of 2000 W may be required in the second mentioned case. Given this power reserve, there is, however, the risk that when examining a small test object a high high-frequency power and, thus, a flip angle of a higher order, with the correspondingly high and possibly even dangerous high-frequency power is set by an unexperienced or careless operator.

Now, it is an object of the present invention to improve a nuclear magnetic resonance tomograph such that the high frequency field strength can be standardized or calibrated, even for a low-frequency power, without the necessity to carry out nuclear resonance measurements, so that any damage to the patients can be definitely excluded.

SUMMARY OF THE INVENTION

The shortcomings illustrated by the related art are addressed by the nuclear magnetic resonance tomograph of this invention. The advantageous operation of the present invention is afforded by provision of a magnet surrounding a measuring space for receiving an object under test;

a coil for generating a high-frequency magnetic field within said measuring space;

a transmitter for generating a high-frequency current, said transmitter comprising means for adjusting an amplitude of said current;

connection means for interconnecting said transmitter and said coil;

high-frequency magnetic field sensor means arranged at a predetermined calibration location outside said measuring space for measuring said high-frequency magnetic field at said predetermined calibration location; and control means connected with an input thereof to said sensor means and with an output thereof to said means for adjusting to set said high-frequency current amplitude in dependency of said measured high-frequency magnetic field.

In particular, the control means shall comprise:

first means for setting a first high-frequency current of a predetermined first amplitude value;

second means for receiving a first sensor signal from said sensor means corresponding to a first high-frequency magnetic field value as a response to said first high-frequency current;

third means for extrapolating said first high-frequency magnetic field value to a second high-frequency magnetic field value by multiplication with a given constant reflecting a constant first ratio between high-frequency magnetic field strength values within said measuring space and at said predetermined calibration location for said coil;

fourth means for establishing a second ratio between said second high-frequency magnetic field value and said first high-frequency current amplitude value;

fifth means for calculating a second high frequency current amplitude value from said second ratio and a desired third high-frequency magnetic field value to be established within said measuring space; and sixth means for setting said second high-frequency current amplitude value as an output of said transmitter.

Thus, the invention opens up numerous possibilities of carrying out nuclear magnetic resonants tomography measurements. For example, it is possible with the invention to run a mere calibration program the results of which being used for adjusting the nuclear magnetic resonance tomograph. Or else the invention may be used for controlling the high-frequency field strength continuously, in which case the before-described calibration program is caused to run automatically, and is used for the continuous adjustment and, if necessary, readjustment of the high-frequency field strength, without any need for the operator of the tomograph to start a calibration program manually before every new run. Finally, the invention opens up the possibility to provide a safety circuit which will detect the presence of an excessively strong high-frequency magnetic field and activate a corresponding emergency cut-off arrangement in the event a malfunction in the high-frequency transmitter circuit should occur.

For this purpose, the amplifier of the device according to the invention may, preferably, be adjustable as regards its amplification factor, and an amplification control input of the amplifier may be connected to an automatic control which has its input connected to the measuring coil.

Further, the input of the amplifier may be connected selectively to a nuclear resonance pulse generator or to a calibrated high-frequency generator so that a calibration program and a measuring program may be run either automatically, as described above, or manually.

Finally, the alarm device may be implemented in the described application by connecting the measuring coil to an automatic control provided with an alarm output.

A particularly preferred embodiment of the tomograph according to this invention employs a measuring coil for measuring the high-frequency field strength which is arranged outside the measuring space, in a toroidal space between a cylindrical inner wall and a cylindrical outer wall of a hollow-cylindrical strip resonator.

These measures provide the advantage that the measuring coil may be optimized, regarding its location, and can then be fixed in this optimized position, without the measuring sequence being disturbed in any way by this procedure, the toroidal space being anyway inaccessible for the object under investigation.

DESCRIPTION OF THE INVENTION

Figure 1:
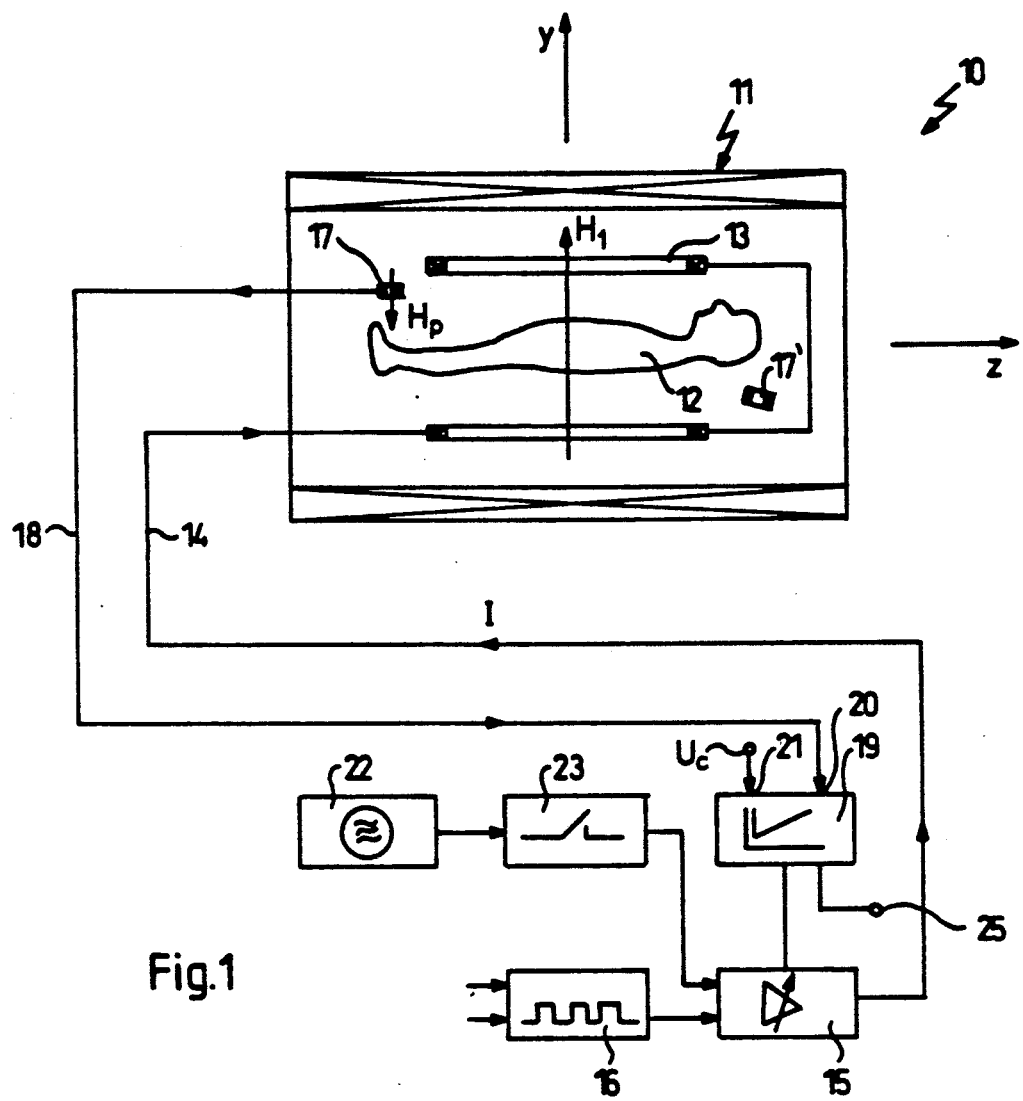
FIG. 1 shows a very schematic overall view of a nuclear magnetic resonance tomograph illustrating the invention.

In FIG. 1, a nuclear magnetic resonance tomograph is indicated generally by reference numeral 10. The tomograph 10 comprises a magnet 11 of high field strength and high homogeneity. The magnet 11 may be a normally conductive or a superconductive magnet. The magnet 11 defines a longitudinal axis z and an axis Y extending perpendicularly thereto.

A patient 12 has been introduced into the magnet 11 in the direction of the z axis. The patient 12 is further surrounded by a rf coil 13 defining the measuring space for the patient 12. In addition, the interior of the magnet 11 contains gradient coils which are, however, not shown in FIG. 1 for the sake of clarity and which, besides, are generally known to the person of ordinary skill.

The rf coil 13 is fed via a rf line 14 from an amplifier 15 which has its input connected to a pulse generator 16 of usual design. The pulse generator 16 is capable of generating pulse programs, i.e. sequences of keyed rf signals where 90° and 180° pulses, for example, are linked to form conventional pulse programs. This, too, has been known before so that there is no need to explain it here once more.

Now, contrary to the known nuclear spin tomographs, the device according to the invention comprises at least one measuring coil 17 or 17' located outside the measuring space. The at least one measuring coil 17 is connected via a measuring line 18 to a measuring input 20 of an automatic control 19, while a reference input 21 of the automatic control 19 is connected to a calibrating voltage $U_c$. The output of the automatic control 19 is connected to an amplification control input of the amplifier 15 which is adjustable as regards its amplification factor.

Another input of the amplifier 15 is connected to a rf generator 22 whose output is provided with a push-button 23.

Finally, the automatic control 19 is provided with an alarm output connection 25.

The operation of the device illustrated in FIG. 1 will now be described in more detail by way of the diagrams of FIGS. 2 and 3.

In normal operation of the nuclear resonance unit, the input of the amplifier 15 is connected to the pulse generator 16. The amplifier 15 sends a rf current I into the rf coil 13, via the rf line 14. As a result of the pulse program, a measuring current $I_m$ is supplied into the rf coil 13 in the described operating mode, when the keyed pulses are applied.

Consequently, the rf coil 13 generates a rf magnetic field with the field strength $H_1$ extending substantially in the y direction, as indicated in FIG. 1.

The rf coil 13 is loaded electrically by the patient 12 whose body tissue causes both dielectric losses and magnetic losses, due to eddy currents encountered. So, even if the value of the measuring current $I_m$ were measured, this would still be no measure of the active rf field strength $H_1$ as the quality of the rf coil 13 may vary within very broad limits, i.e. between Q=200 when the coil is largely unloaded or loaded by a very small patient 12, and Q=20 when the coil is heavily loaded by a patient 12 of high weight.

Now, in order to enable the rf field strength $H_1$ to be adjusted in a calibrated, i.e. reproducible manner, one first carries out a calibration measurement. This is done with the pulse generator 16 switched off. Instead, the amplifier 15 is controlled by the rf generator 22 whose frequency corresponds to the basic frequency of the pulse generator 16. By actuating the push-button 23, one then feeds a calibration current $I_c$ into the rf coil 13, via the rf line 14. This calibration current leads to a first rf field strength $H_{11}$ which, in principle, may be very low as this rf field strength is not intended to excite nuclear resonances in the patient 12.

The field lines produced in this manner also pass through the at least one measuring coil 17, with a field strength $H_{p1}$, which usually differs from the active rf field strength $H_{11}$, the measuring coil 17 being located outside the measuring space.

The rf field strength $H_{p1}$ passes through the measuring coil 17 and induces in the latter a measuring voltage which can be tapped via the measuring line 18.

Now, it can be determined for any kind of rf coil 13 by suitable laboratory measurements that the field strength $H_p$ in a measuring coil 17 arranged at any suitable position is proportional to the active field strength $H_1$ in the measuring space, and this largely independently of the degree in which the rf coil 13 is loaded by different test objects. This is as true for different space factors as for different positions which smaller test objects may assume inside the rf coil 13, so that hereafter the term "space factor" will be used for all these effects.

To say it in other words, this means that every object which is introduced into the rf coil 13 has the same effect on the active rf field strength $H_1$ and the field strength $H_p$ acting in the measuring coil 17, irrespective of its size or position.

On the other hand, it is also known for a given rf coil 13 that the active rf field strength varies in proportional relation to the rf excitation current when the test object remains unchanged, i.e. the space factor remains constant.

Figure 2:
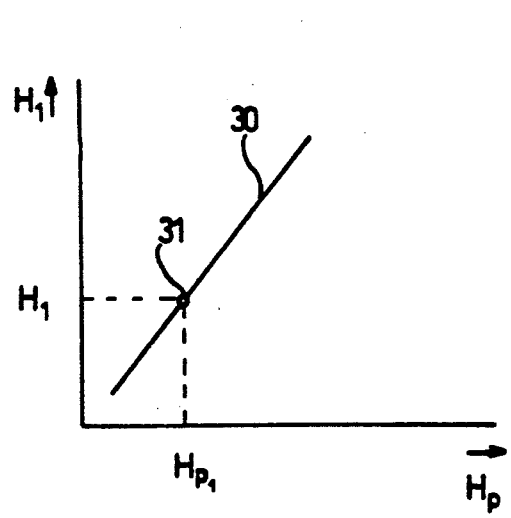
FIG. 2 shows a diagram illustrating the proportionality of the high-frequency field strengths inside and outside the measuring space of a high-frequency coil used within the tomograph of FIG. 1.

FIG. 2 now shows a straight line 30 representing the proportional relationship between the active rf field strength $H_1$ and the field strength $H_p$ measured in the measuring coil 17. The straight line 30 is a system constant and can be determined in the laboratory in advance, in the described way, for any given rf coil 13.

If, during the before-described calibration program, the known output signal of the rf generator 22 is applied momentarily to the rf coil 13, via the amplifier 15, i.e. when the rf current is adjusted to a calibrated value $I_c$ and a rf field strength $H_{p1}$ is subsequently determined in the measuring coil 17, then the calibration point 31 on the straight line 30, pertaining to the field strength $H_{p1}$, leads to a rf field strength $H_{11}$ active in the measuring space.

This field strength $H_{11}$, therefore, is the rf field strength active in the measuring space when the calibrating current $I_c$ is active as the rf excitation current.

Figure 3:
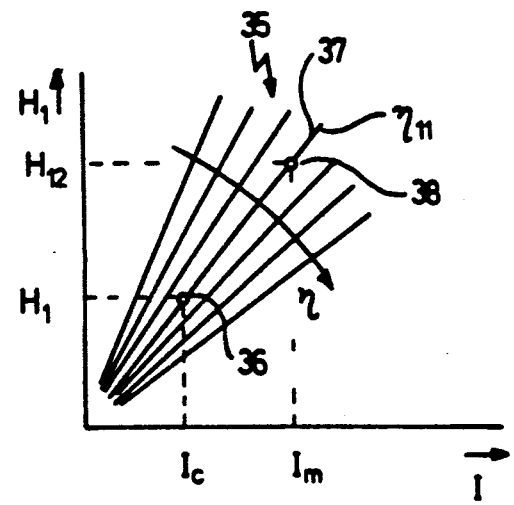
FIG. 3 shows another diagram illustrating the proportionality between the high-frequency field strength in the measuring space and the excitation current, as a function of the filling factor.

FIG. 3 shows in this connection a diagram illustrating the dependence between the active rf field strength $H_1$ and the rf current I applied at any time, as a function of the space factor $\eta$. As has been mentioned before, $H_1$ and I show a proportional behavior, relative to each other, but their proportionality constant, i.e. the steepness of the straight line of the bundle of lines 35 in FIG. 3, is determined by the space factor $\eta$.

On the other hand, one has a measuring point in the diagram of FIG. 3 thanks to the before-described calibration program, i.e. the calibration point 36, the latter being defined by the calibration current $I_c$ and the active rf field strength $H_{11}$ determined on the basis of FIG. 2. The calibration point 36, therefore, determines the straight line 37 from among the bundle of lines 35 and, thus, the space factor $\eta_{11}$ prevailing at any time.

This completes the calibration process because the relationships between the active rf field strength $H_1$ and the rf excitation current I are now defined for the particular application or the particular patient 12 or, to say it in terms of physics, the particular space factor $\eta_{11}$.

If, for example, one intends to adjust an active rf field strength $H_{12}$ which corresponds exactly to a flip angle of 90° or 180° for a given pulse length, then one only has to determine the matching rf measuring current $I_m$ by means of the straight line 37, as illustrated by the measuring point 38 in FIG. 3.

Given the described proportionality, it is, however, also possible to simply determine the relation $H_{12}/H_{11}$ and to adjust the measuring current $I_m$ to the corresponding multiple of the calibrating current $I_c$.

Regarding the block diagram of FIG. 1, this can be effected via the automatic control 19 whose reference input 21 is supplied with the calibrating voltage $U_c$, while its measuring input 20 is supplied with the measuring voltage of the measuring coil 17. The measuring voltage $U_c$ represents the calibrating current $I_c$ so that the dependence ratio between the rf field strength $H_1$ and the rf current I given at any time can be determined by deriving the ratio or difference between the signals obtained at the inputs 20, 21, in combination with the known straight line 30 of FIG. 2. This proportionality, or the steepness of the straight line of the bundle of lines 35 in FIG. 3, can now be translated into an amplification factor for the amplifier 15 so that the output signal of the pulse generator 16, which has a predetermined amplitude, is translated into a measuring current $I_m$ adapted to the space factor $\eta$ prevailing at any time, in response to this steepness or to the amplification factor.

If the nuclear spin tomograph 10 is to be calibrated with the patient 12 located in the measuring space, it is, thus, only necessary to actuate the push-button 23 momentarily, with the pulse generator switched off, in order to adjust the automatic control and/or the amplifier 15 as required. Once the pulse generator 16 has been switched on, its output can be set to a signal amplitude which exactly leads to the desired 90° or 180° pulse for the calibrated amplification factor of the amplifier 15.

During operation of the nuclear resonance measuring process, the automatic control 19 may perform an alarm function. This can be achieved by measuring the rf field active during the nuclear resonance measurement, using the measuring coil 17, and comparing the rf field so measured with an admissible limit value via the reference input 21. When the limit value is exceeded, the alarm output 25 is activated which may lead, for example, to the amplifier 15 being switched off.

The measuring coil 17 may be arranged at different locations, relative to the rf coil 13. It has been mentioned before that the respective position of the measuring coil 17 may be optimized empirically so that the straight line 30 in FIG. 2 can be determined and will then be valid for all loading conditions of the rf coil 13 It has been found in practical tests that the proportionality, i.e. the steepness of the straight line 30 in FIG. 2, is in fact slightly dependent on the space factor of the rf coil 13, but these variations are substantially less important than the errors encountered in practical operation of today's nuclear spin tomographs 10 as a result of inaccurate adjustments.

There is also the possibility to provide more than one measuring coils 17, 17' whose output signals are then combined to form a total signal, for example by forming the mean value thereof.

Figure 4:
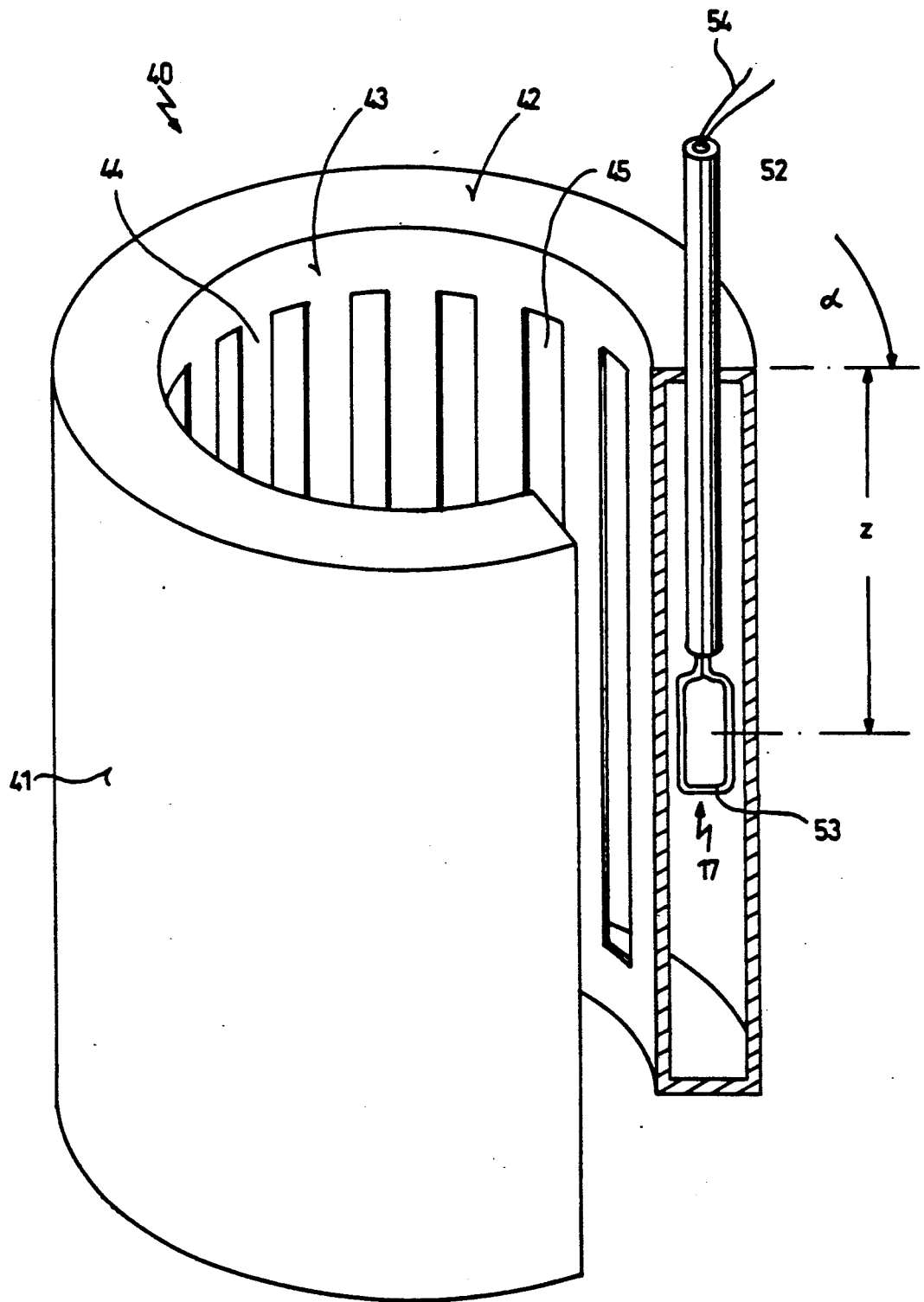
FIG. 4 shows a perspective view, partly cut open, of a probe head of the type preferably used in a tomograph according to the invention.
Figure 5:
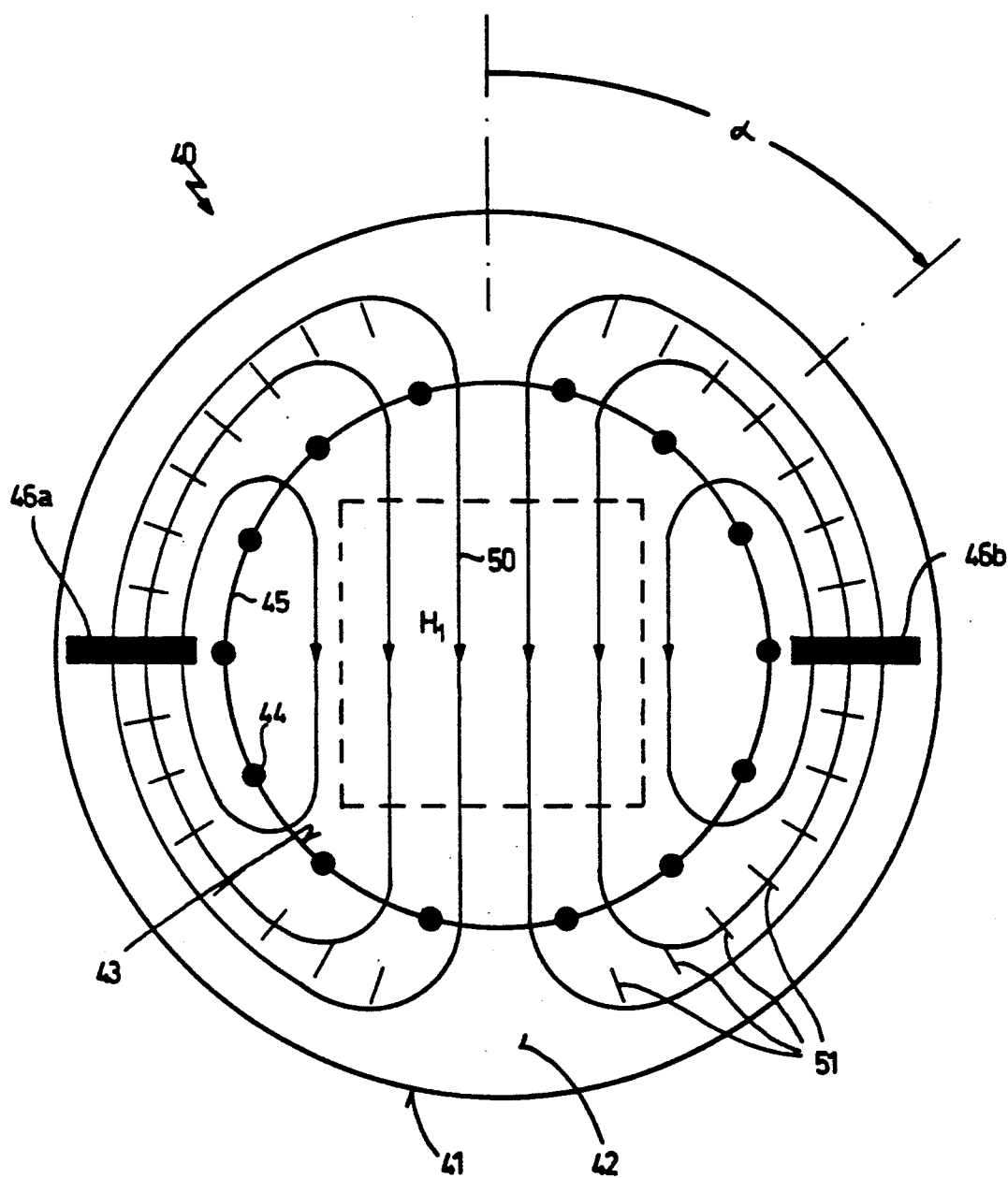
FIG. 5 shows a radial section through the probe head illustrated in FIG. 4.

FIGS. 4 and 5 now illustrate a particular arrangement of the measuring coil 17 by way of example, which is however by no means meant to limit the invention.

FIGS. 4 and 5 show a substantially hollow-cylindrical resonator 40 whose cylindrical outer wall 41 and whose end walls 42 are closed for rf currents, While the cylindrical inner wall 43 is subdivided in the axial direction into conductive strips 44 and non-conductive slots 45. In FIG. 5, additional coupling elements 46a and 46b can be seen which are arranged in diametrically opposite positions in the toroidal space between the walls 41 and 43.

The resonator 40 is illustrated in FIGS. 4 and 5 very diagrammatically; additional details can be seen in DE-A-35 22 401. The reader is insofar referred to the disclosure content of that publication.

In FIG. 5, reference numeral 50 designates field lines of the rf magnetic field which extend through the measuring space in the cylindrical inner wall 43 largely homogeneously in radial direction relative to the longitudinal axis of the resonator 40.

Possible positions for the measuring coil 17 are designated by reference numeral 51. As can be seen best in FIG. 4, the measuring coil 17 consists, preferably, of a rod 52 extending in axial direction and carrying a wire loop 43 at its lower end, in the area of the space between the walls 41 and 43. The wire loop 43 is connected to the outside via supply lines 54 which lead to a measuring line 18.

In FIGS. 4 and 5, $\alpha$ designates a circumferential angle by which the positions 51 can be displaced relative to a longitudinal center plane extending perpendicularly to the plane of the coupling elements 46. In addition, the depth of penetration of the wire loop 53 into the space between the walls 41 and 43 is designated by z in FIG. 4.

By varying $\alpha$ and z, it is now possible to find the optimum position 51, with respect to azimuth ($\alpha$) and depth (z). In this context, the optimum position is the one with the least possible dependence of the proportionality between $H_1$ and $H_p$ on the space factor $\eta$.

Practical tests have shown for a resonator 40 of the type illustrated in FIGS. 4 and 5 that an optimum position 51 is reached at a value $\alpha=45°$ and a depth z equal to approximately half the axial length of the resonator 40.

Further, it has been found that the optimum position so found is then valid for all units of a particular class of resonators 40, as used in practice for a given type of examinations. For, in practice a big resonator resonator 40 will be used for whole-body measurements, while another, smaller resonator will be used for head measurements, and a third, even smaller resonator will be used for measurements on limbs or small experimental animals. The described optimum position can be determined for each such type of resonators and will then be valid with reasonable accuracy for any space factor, and even for varying positions of the test object in the measuring space.

I claim:

1. A nuclear magnetic resonance tomograph comprising:
    a magnet surrounding a measuring space for receiving an object under test;
    a coil for generating a high-frequency magnetic field within said measuring space;
    a transmitter for generating a high-frequency current, said transmitter including means for adjusting an amplitude of said current;
    connection means for interconnecting said transmitter and said coil;
    high-frequency magnetic field sensor means arranged at a predetermined calibration location outside said measuring space for measuring said high-frequency magnetic field at said predetermined calibration location; and
    control means connected with an input thereof to said sensor means and with an output thereof to said means for adjusting to set said high-frequency current amplitude in dependency of said measured high-frequency magnetic field.

2. The tomograph of claim 1, wherein said control means is operable to:
    set a first high-frequency current amplitude value of a predetermined first amplitude value;
    receive a first sensor signal from said sensor means corresponding to a first high-frequency magnetic field value as a response to said first high-frequency current amplitude value;
    extrapolate said first high-frequency magnetic field value to a second high-frequency magnetic field value by multiplication with a given constant reflecting a constant first ratio between high-frequency magnetic field strength values within said measuring space and at said predetermined calibration location for said coil;
    establish a second ratio between said second high-frequency magnetic field value and said first high-frequency current amplitude value;
    calculate a second high-frequency current amplitude value from said second ratio and a desired third high-frequency magnetic field value to be established within said measuring space;
    set said second high-frequency current amplitude value as an output of said transmitter.

3. The tomograph of claim 1, wherein said transmitter comprises an amplifier, an input of said amplifier being adapted to be connected selectively to a nuclear resonance pulse generator or to a calibrated high-frequency generator.

4. The tomograph of claim 1, wherein said sensor means comprises a measuring coil.

5. The tomograph of claim 1, wherein said sensor means is connected to a threshold device actuating an alarm output.

6. The tomograph of claim 1, wherein said sensor means is arranged in a toroidal space between a cylindrical inner wall and a cylindrical outer wall of said coil being configured as a hollow-cylindrical strip resonator.

7. The tomograph of claim 6, wherein said sensor means is offset by 45° relative to coupling elements provided at diametrically opposite locations of said toroidal space.

8. The tomograph of claim 1, wherein a plurality of sensor means are provided and output signals of said sensor means are fed to mean value generating means.

* * * * *